United States Patent [19]

Selway et al.

[11] 4,097,891
[45] Jun. 27, 1978

[54] LASER STUD MOUNTS

[75] Inventors: Peter Richard Selway; Martin Chown; Richard Edward Epworth, all of Harlow; Norman Derek Leggett, Hoddesdon; Harish Ram Dass Sunak, Bishops Stortford, all of England

[73] Assignee: International Standard Electric Corporation, New York, N.Y.

[21] Appl. No.: 670,323

[22] Filed: Mar. 25, 1976

[30] Foreign Application Priority Data

Apr. 1, 1975 United Kingdom .............. 13203/75

[51] Int. Cl.² ........................................... H01L 23/12
[52] U.S. Cl. ................ 357/81; 331/94.5 H; 331/94.5 R; 357/17; 357/18; 357/74
[58] Field of Search ............... 331/94.5 H, 94.5 P; 330/4.3; 357/18-19, 17, 74, 81; 350/96 WG, 96 R

[56] References Cited

U.S. PATENT DOCUMENTS

| | | | |
|---|---|---|---|
| 3,445,786 | 5/1969 | Snyder et al. | 331/94.5 P |
| 3,585,454 | 6/1971 | Roberts | 357/18 |
| 3,590,248 | 6/1971 | Chatterton, Jr. | 331/94.5 H |
| 3,660,669 | 5/1972 | Grenon | 357/19 |
| 3,803,511 | 4/1974 | Thompson | 331/94.5 H |
| 3,840,889 | 10/1974 | O'Brien et al. | 331/94.5 H |
| 3,932,184 | 1/1976 | Cohen et al. | 331/94.5 H X |

OTHER PUBLICATIONS

Kressel et al., Journal of Applied Physics, vol. 43, No. 2, Feb. 1972, pp. 561-562.
Kressel et al., Electronics, Mar. 16, 1970, pp. 78-86 (especially p. 86).

*Primary Examiner*—Stanley D. Miller, Jr.
*Assistant Examiner*—James W. Davie
*Attorney, Agent, or Firm*—John T. O'Halloran; Peter C. Van Der Sluys

[57] ABSTRACT

A laser stud mount wherein one terminal connection is provided by the stud and the other by a strip line. One embodiment includes a light guide extending through the stem of the stud mount or along the surface of the stud base for monitoring the light output from the back end of the laser. The monitored light from the back end of the laser can be used to regulate the laser drive.

8 Claims, 9 Drawing Figures

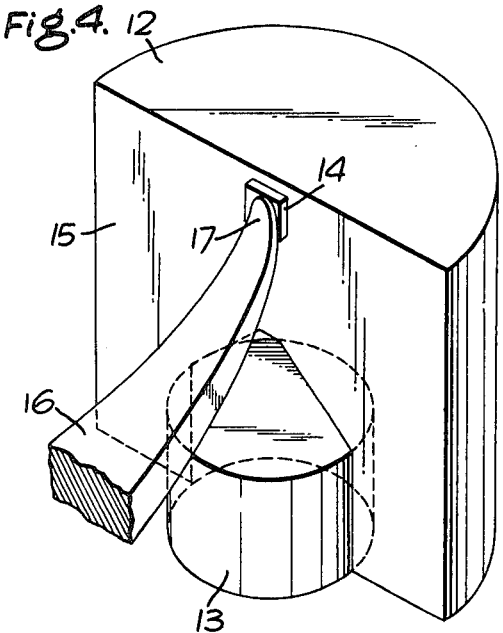
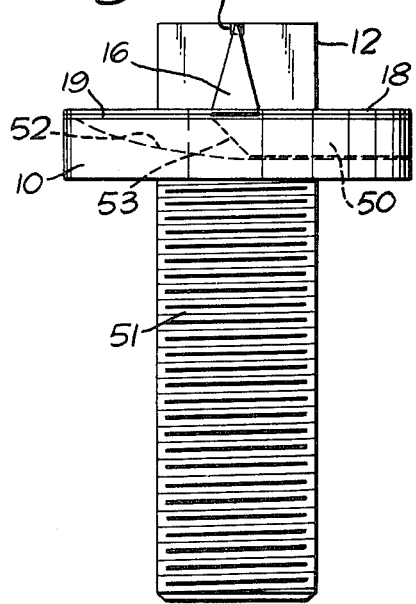
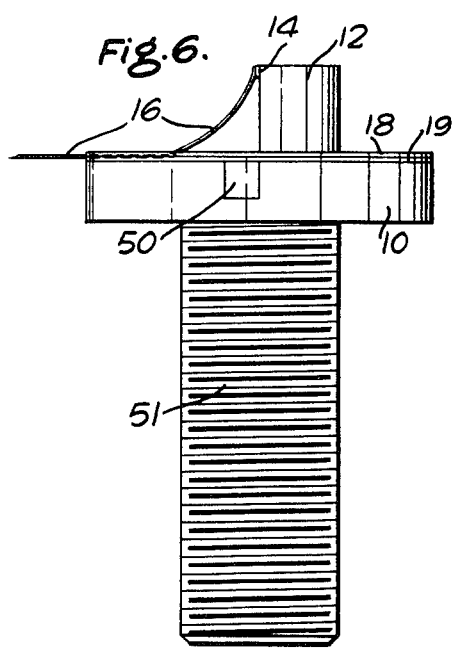

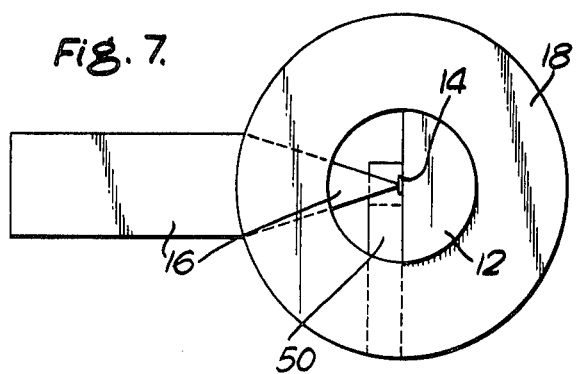
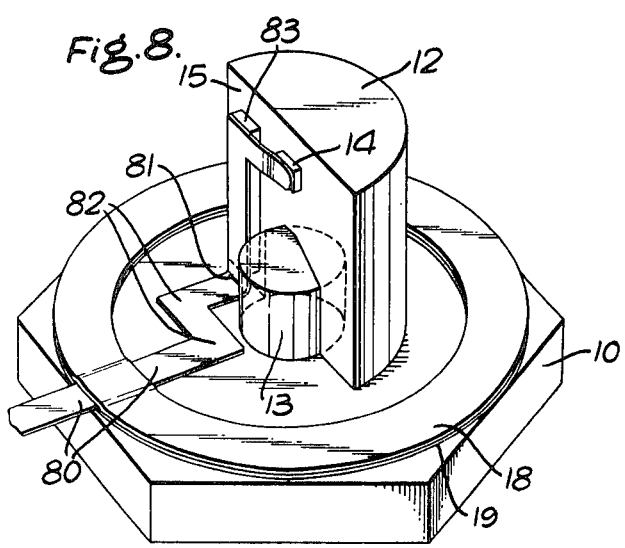
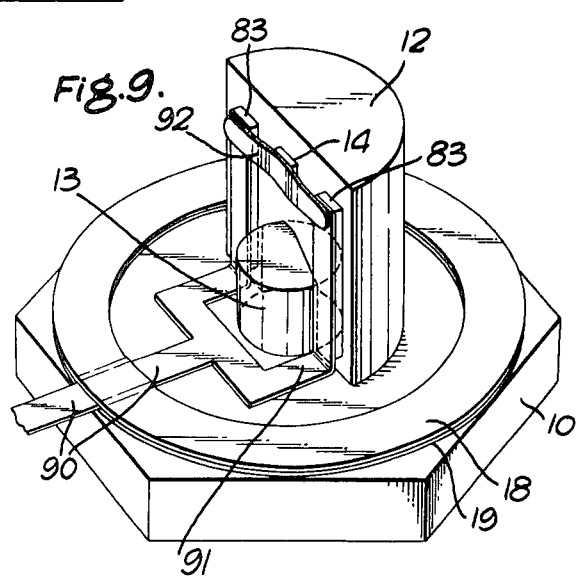

LASER STUD MOUNTS

FIELD OF THE INVENTION

This invention relates to laser stud mounts.

SUMMARY OF THE INVENTION

According to the present invention there is provided a laser stud mount having a metallic base from one side of which protrudes a stem and on the other side of which is located a heat sink, which when in use has an injection laser chip mounted against one side thereof, wherein the stem, base and heat sink provide one terminal connection for the chip while the other terminal connection is provided by a strip-line secured to the base on the side opposite the stem by electrically insulating material so that the strip-line extends over the surface of the base and up spaced from one side of the heat sink.

In laser assemblies in which a semiconductive laser is mounted on such a stud mount with its optic axis parallel or co-axial with the stem of the stud mount this use of a strip for making terminal connection facilitates the use of a light guide to collect light emitted toward the stem. This collected light may be detected by a photosensor and used for monitoring the radiant power output of the laser.

BRIEF DESCRIPTION OF THE DRAWINGS

FIG. 4 is an enlarged top perspective view of the laser stud mount of FIG. 3;

FIGS. 5 and 6 are side views of alternate embodiments of the laser stud mount of FIG. 1;

FIG. 7 is a top view of an alternate embodiment of the laser stud mount of FIG. 3; and FIGS. 8 and 9 are top perspective views of two further embodiments of the laser stud mount of FIG. 4.

DESCRIPTION OF THE PREFERRED EMBODIMENT

Figure 1:
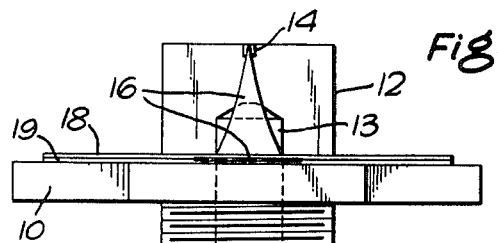
FIG. 1 is a side view of one embodiment of the laser stud mount of this invention.
Figure 2:
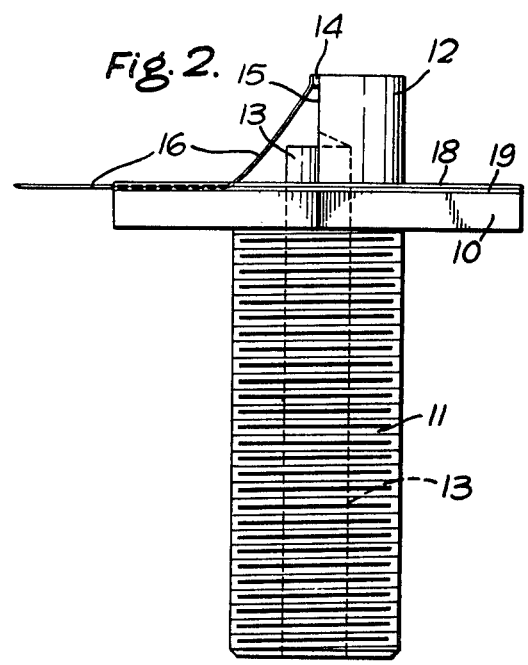
FIG. 2 is a side view of a further embodiment of the laser stud mount of FIG. 1.
Figure 3:
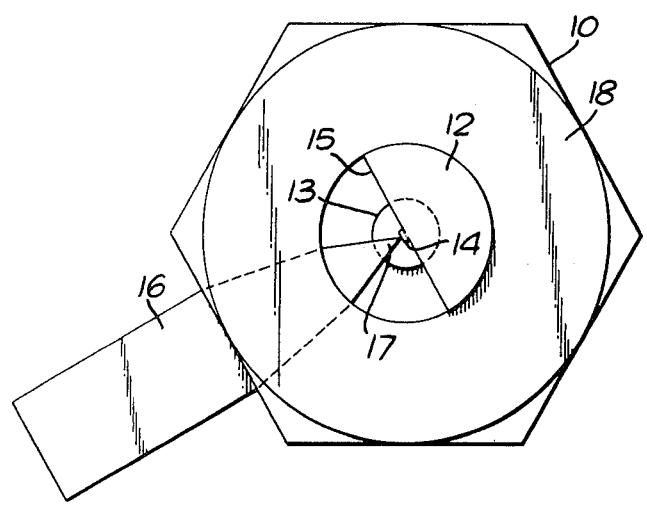
FIG. 3 is a top view of the laser stud mount of FIG. 2.

Referring to FIGS. 1, 2, 3 and 4 the body of a laser stud mount comprises a base 10, from one side of which protrudes an externally threaded stem 11, and on the other side of which is located a gold plated copper heat sink 12. In one construction this is an integral structure formed entirely in copper (except for the gold plating), but in another construction it is a two part structure in which the copper heat sink 12 is secured to the base and stem, 10 and 11, which are made of a lead-free steel.

The stem is drilled along its axis to provide a bore through which a light guide 13 is fitted and sealed. In forming this bore the drilling is extended into the heat sink 12 to terminate just short of its top surface. In this way the inner end of the light guide 13 is enabled to come close to the end of a c.w. laser chip 14 bonded, for instance by hot gas soldering, on to the side 15 of the heat sink 12 with its optical axis coaxial with the axis of the stem 11. The c.w. laser chip 14 is of the type which is operable at room temperature. If desired there may be an intermediate diamond heat sink (not shown) interposed between the chip 14 and the main heat sink 12.

The light guide may be, but is not necessarily, a composite structure having a core region surrounded by a lower refractive index cladding.

One terminal connection for the laser chip 14 is provided by the stud itself, while the other is provided by a thin resilient tapering strip-line 16. This strip-line, which is conveniently made of phosphor bronze or beryllium copper, or a nickel alloy is made from 3.0mm and 0.8mm thick strip which is tapered down in both width and thickness towards the tip 17, which is held in contact with the laser chip 14. In this way the area of contact between the strip and the laser is a substantial portion of the total area of the exposed surface of the laser, and it has been found that for some applications an adequate electrical contact can be provided by pressure alone obviating the need for making a bonded connection to this side of the laser.

The strip-line 16 is secured between two glass or ceramic annuli 18, 19 to the base 10. Preferably the characteristic impedance of the strip-line should match the low impedance of the laser chip, and hence the annuli are relatively thin, typically about 0.3mm. One way of securing the strip-line and the annuli to the base is to use an adhesive, such as an epoxy resin, applied round the outer edge of the annuli. If, however, it is desired to exclude the possibility of contamination of the laser by vapors evolved from such a resin the annuli can be appropriately metallized and soldered in position on the base. This may involve first forming a sub-assembly of the strip-line glass-to-metal sealed between the two annuli. Alternatively, instead of using a pair of annuli, a single ceramic annulus may be used which has been created with the strip-line already sealed radially through one wall. If the chosen method of securing the strip-line and annulus or annuli to the base involves high temperatures this may make it necessary to make the soldering of the laser to the heat sink a subsequent process step. In other circumstances the soldering of the laser may be performed before or after the fixing of the strip-line according to which ever is the more convenient.

The construction of the laser stud mount depicted in FIGS. 5, 6 and 7 is very similar to that depicted in the preceding figures, the principal difference being in the shape and location of its light guide 50 (The integers that are essentially common to both constructions are identified by the same reference numerals in each.) whereas the previous construction is designed to provide a light output for monitoring purposes on the side of a mounting plate opposite that of the main optical output, in this construction the two outputs are located on the same side.

For this reason in this construction the threaded stem 51 is not bored out, but is left solid. Instead of this, a square sided and flat bottomed groove 52 is milled in the upper surface of the base 10 immediately in front of the face of the heat sink to which the laser 14 is later bonded. The groove 52 is dimensioned so that it just accommodates a square sectioned light guide 53 which extends from underneath the laser to one side edge of the plate 10.

The inner end 53 of the light guide is chamfered at 45° so that light from the laser passing through the upper side wall of the guide is reflected at the chamfered end, and thereafter guided substantially axially along the guide. As in the previously described embodiment, the guide may be a two part structure comprising a central core surrounded by a lower refractive index cladding.

The milling of the groove 52 is terminated short of the other side edge so that a cap (not shown) can be fitted to the upper annulus 18 to provide a sealed enclosure for the laser chip 14. A guide with a rectangular cross-section can be used in place of the square cross-sectional one. It is also possible to use other prismatic shapes. It is generally preferable to employ a prismatic body rather than a cylindrical one because the facets of the former facilitate the side entry of the laser radiation and also serve to locate the guide with the appropriate orientation of the chamfered inner end.

The above described mounts have the common characteristic that the strip-line curves up through 90° in a gentle radius from being parallel with the base to lying against the laser chip. This involves the strip-line being considerably further from its ground plane at the middle of the curve than it is at either end of the curve. This can be avoided by adopting either of the configurations of strip-line illustrated in construction of FIGS. 8 and 9. These constructions are essentially the same as that described previously with reference to FIGS. 1 to 4.

In the construction of FIG. 8 the strip-line 80 extends in a plane substantially parallel with, and just spaced from, the top surface of the base 10 almost as far as the heat sink 12. Just in front of the heat sink there is a sharp right angled bend 81 in the strip-line which thereafter extends in a plane substantially parallel with and similarly just spaced from, the side wall is of the heat sink. A double crank is provided at 82 to give clearance between the strip-line and the protruding inner end of the light guide 13. A dielectric spacer 83 secured to the side of the heat sink prevents accidental contact between the strip-line and heat sink. The same configuration of strip-line may also be used to replace the strip-line of the construction previous described with reference to FIGS. 5, 6 and 7.

In the construction of FIG. 9 the strip-line 90 is like the strip-line 80 of FIG. 8 except that a second branch 91 is provided going up the other side of the light guide. The two branches are linked by a cross member 92 which bears against the laser chip 14. This cross member may be a short length of metal braid or metal tape, or may be formed integral with the rest of the strip-line. The same configuration of strip-line may also be used to replace the strip-line of the construction previously described with reference to FIGS. 5, 6 and 7.

Either or both of the ends of the light guide 13 previously described with reference to the embodiments of FIGS. 1, 2, 3, 4, 8 and 9 may terminate in a lens element (not shown) designed in one instance to improve the collection of light from the laser 14, and in the other instance to bring the collected light to a focus. Such lens elements may be formed integral with the light guides or may be plano-convex elements bonded to the light guides.

What is claimed is:

1. A laser apparatus comprising:
   a metallic base;
   an externally threaded stem coupled to and extending from one side of said base, said stem having a bore therein along its axis;
   a heat sink coupled to and extending from another side of said base, said bore extending into said heat sink;
   an injection laser mounted on said heat sink and having a first terminal provided by said stem, base and heat sink;
   a strip line forming a second terminal for said injection laser;
   a body of electrically insulating material coupled to said base for securing said strip line; and
   a light guide consisting of a core region surrounded by a lower refractive index cladding region extending through the stem in said bore for receiving radiation from said laser and transmitting said radiation.

2. The apparatus of claim 1 wherein said light guide terminates at either of its ends in a convex lens element.

3. The apparatus of claim 1 wherein said strip-line is secured to said base between two electrically insulating annuli selected from the group consisting of glass and ceramic.

4. The apparatus of claim 3 wherein said strip-line is sealed radially through one wall of a ceramic annulus which is secured to said base.

5. The apparatus of claim 1 wherein said base, said stem and said heat sink are an integral structure composed of copper.

6. The apparatus of claim 1 wherein said base and said stem are an integral structure composed of steel and said heat sink is composed of copper.

7. The apparatus of claim 1 wherein said heat sink further includes a diamond intermediate heat sink.

8. The apparatus of claim 1 wherein said injection laser is a room temperature operable c.w. laser.

* * * * *